United States Patent [19]
Davis

[11] Patent Number: 5,838,171
[45] Date of Patent: Nov. 17, 1998

[54] LOW POWER REAL-TIME CLOCK CIRCUIT HAVING SYSTEM AND BATTERY POWER ARBITRATION

[75] Inventor: Timothy Don Davis, Arlington, Tex.

[73] Assignee: National Semiconductor Corporation, Santa Clara, Calif.

[21] Appl. No.: 755,279

[22] Filed: Nov. 22, 1996

[51] Int. Cl.⁶ .................................................. H03K 5/24
[52] U.S. Cl. ................................ 327/19; 327/63; 327/68; 327/70
[58] Field of Search ............................ 327/19, 512, 513, 327/533, 540, 541, 543, 63, 68, 70, 74, 77, 99, 65, 545; 307/43, 44, 126

[56] References Cited

U.S. PATENT DOCUMENTS

| | | | |
|---|---|---|---|
| 4,945,267 | 7/1990 | Galbraith | 307/571 |
| 5,272,393 | 12/1993 | Horiguchi et al. | 307/296.6 |
| 5,281,866 | 1/1994 | Rundel | 307/269.3 |
| 5,321,653 | 6/1994 | Suh et al. | 365/189.09 |
| 5,457,414 | 10/1995 | Inglis et al. | 327/77 |
| 5,504,452 | 4/1996 | Takenaka | 327/541 |
| 5,510,735 | 4/1996 | Mahabadi | 327/77 |
| 5,528,201 | 6/1996 | Davis | 331/116 FE |
| 5,642,063 | 6/1997 | Lehikoinen | 327/74 |

OTHER PUBLICATIONS

Vittoz, E.A., et al. "A Low–Voltage CMOS Bandgap Reference," pp. 573–577, *IEEE Journal of Solid–State Circuits*, vol. SC–14, No. 3, Jun. 1979.

Tzanatias, G. et al., "A CMOS Bandgap Voltage Reference," pp. 655–657, *IEEE Journal of Solid–State Circuits*, vol. SC–14, No. 3, Jun. 1979.

*Primary Examiner*—Tim Callahan
*Assistant Examiner*—An T. Luu
*Attorney, Agent, or Firm*—Limbach & Limbach LLP

[57] ABSTRACT

A circuit for power arbitration, low battery voltage detection, and the operation of battery backed circuitry for systems in which the system power supply voltage range overlaps that of a battery source. A voltage regulator is used to regulate the battery voltage so that the voltage range of the battery source is below the voltage range of the system supply. The regulator is based on a silicon-bandgap referenced methodology and consumes an insignificant amount of current so that the battery life is not appreciably affected. The regulator also has a smaller variation in its output voltage than the battery. A temperature and supply voltage compensated voltage is produced by the combination of a subthreshold current source, parasitic bipolar devices, and voltage buffering, and used to provide a voltage source for the battery backed circuitry of the system. The regulated voltage is set to a value lower than the system supply and serves as the battery supply input for the power arbitration circuitry. The regulated voltage permits the internal power arbitration scheme of the present invention to be equivalent to existing arbitration circuits even though the battery and system supply voltage ranges overlap.

11 Claims, 12 Drawing Sheets

LOW POWER REAL-TIME CLOCK CIRCUIT HAVING SYSTEM AND BATTERY POWER ARBITRATION

TECHNICAL FIELD

The present invention relates to systems which are designed to operate at a low power level and which use a battery as a backup source of power, and more specifically, to a real-time clock circuit which includes power arbitration circuitry for switching between a system power supply and a battery power source in the case where the voltage range of the system supply overlaps that of the battery.

BACKGROUND OF THE INVENTION

Portable and continuously operating electronic systems often include circuitry which is designed to operate at a low power level. A battery is usually included as a source of backup power to supplement that provided by the system power supply. The systems also include circuitry which arbitrates between the two power sources, choosing whether power is provided by the system supply or the battery and providing a switching mechanism for selecting the appropriate power source.

The systems also typically include a circuit which monitors the battery voltage to provide an alert signal if the battery voltage drops below a critical level and may also include a low power, low voltage oscillator to permit low power state machine operation using the battery as the power source. A typical voltage range for the system power supply is 5 volts (±10%) and a typical voltage range for the battery source is 3 volts (±20%).

Figure 1A:
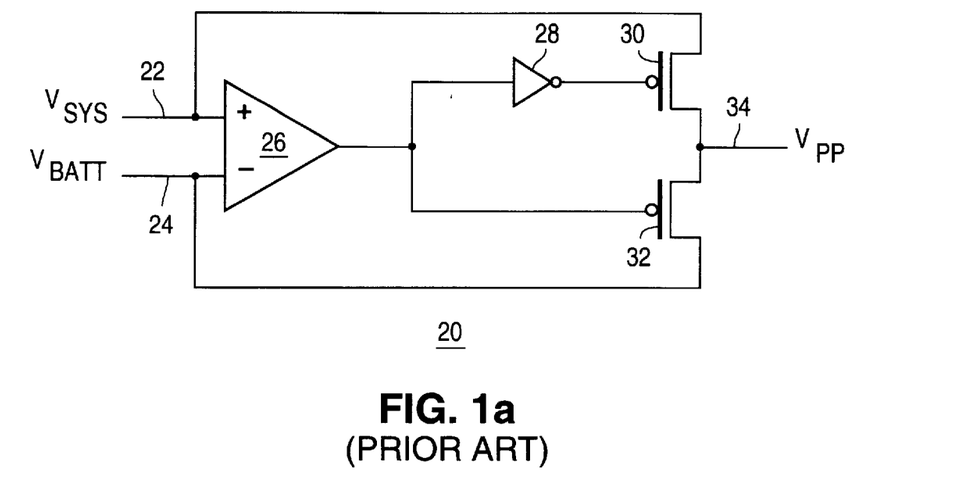
FIGS. 1(a)–(c) are block diagrams showing the (1a) power arbitration, (1b) low battery voltage detection, and (1c) low power oscillator circuitry for a prior art portable or continuous operation system.
Figure 1B:
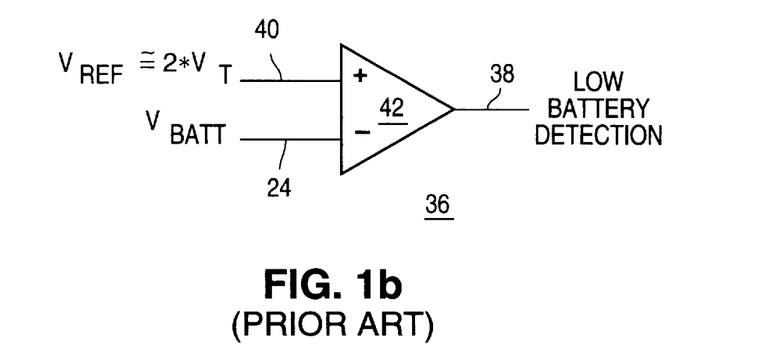
Figure 1C:
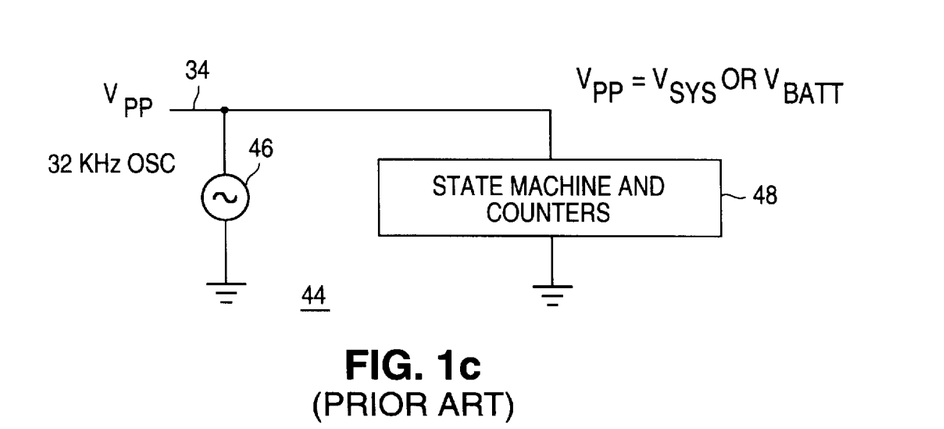

FIGS. 1(a)–(c) are block diagrams showing the (1a) power arbitration, (1b) low battery voltage detection, and (1c) low power oscillator circuitry for a prior art portable or continuous operation system. As shown in FIG. 1(a), power arbitration circuit 20 has as inputs a system supply voltage ($V_{Sys}$) 22 and a battery supply voltage ($V_{Batt}$) 24. Power sources 22 and 24 are input to comparator 26 which is configured to produce an output signal indicative of which input is higher. The output signal from comparator 26 is provided to inverter 28 and as a control signal to the gate of transistor 32. The output of inverter 30 is provided as a control signal to the gate of transistor 30. Arbitration circuit 20 functions to select the higher of either $V_{Sys}$ or $V_{Batt}$ 24 as the power supply voltage for system internal power bus ($V_{pp}$) 34. System supply 22 is chosen when the system is powered and battery source 24 is selected when the system is in the powered down state. Internal bus 34 is connected to the higher supply source within a few milli-volts of the other supply voltage falling below the higher voltage. In this manner, permanent power is maintained on the internal bus.

Low battery voltage detection circuit 36 of FIG. 1(b) acts to provide a warning signal 38 when battery voltage $V_{Batt}$ 24 falls below a predetermined level, $V_{ref}$ 40. In the example of FIG. 1(b), $V_{ref}$ 40 is set equal to approximately twice the turn-on voltage, $V_T$, of the MOS transistor contained in comparator 42. As shown in the FIG. , $V_{Batt}$ 24 and $V_{ref}$ 40 serve as inputs to comparator 42, which outputs low battery detection warning signal 38 when $V_{Batt}$ 24 falls below $V_{ref}$.

Low power oscillator circuitry 44 of FIG. 1(c) functions to provide a real-time clock signal in the form of oscillator 46 for the operation of a device such as a state machine or counter 48. In this case the voltage supplied on internal bus $V_{pp}$ 34 (which equals either the system voltage or the battery voltage) serves as the power supply for oscillator 46 and any other battery-backed circuitry.

The power arbitration circuitry of FIG. 1(a) provides a reliable source of power when the system supply voltage does not overlap the battery supply voltage. This is because the arbitration circuitry can unambiguously identify the higher supply voltage. However, this "higher supply" form of arbitration is not reliable when the system supply voltage range and battery supply voltage range overlap, as can occur, for example, in a system which has a system voltage of 3.3 volts ±10% and a battery voltage of 3 volts ±20%. As such types of lower voltage systems become more common, other methods of voltage arbitration and low battery detection must be developed.

Another aspect of the circuitry of FIGS. 1(a)–(c) is that because for most applications, the circuitry must be integrated with high speed logic devices, components of the circuitry are limited to those available in a high speed digital process. This places a constraint on the available structures and methods which can be used to form the circuitry, and impacts the design of the circuits.

What is desired is circuitry for power arbitration, low battery power detection, and the operation of battery backed circuitry for systems in which the system power supply voltage range overlaps that of the battery source. These and other advantages of the present invention will be apparent to those skilled in the art upon a reading of the Detailed Description of the Invention together with the drawings.

SUMMARY OF THE INVENTION

The present invention is directed to circuitry for power arbitration, low battery voltage detection, and the operation of battery backed circuitry for systems in which the system power supply voltage range overlaps that of a battery source. The present invention is described with reference to the application of a real-time clock, but its principles may be applied to other systems which operate at low power and include a backup battery source of power. The invention uses a voltage regulator which acts to regulate the battery voltage so that the voltage range of the battery source is below the voltage range of the system supply. The regulator is based on a silicon-bandgap referenced methodology and consumes an insignificant amount of current so that the battery life is not appreciably affected. The regulator also has a smaller variation in its output voltage than the battery. A temperature and supply voltage compensated voltage is produced by the combination of a subthreshold current source, parasitic bipolar devices, and voltage buffering, and used to provide a voltage source for the battery backed circuitry of the system. The regulated voltage is set to a value lower than the system supply and serves as the battery supply input for the power arbitration circuitry. The regulated voltage permits the internal power arbitration scheme of the present invention to be equivalent to existing arbitration circuits even though the battery and system supply voltage ranges overlap.

Further objects and advantages of the present invention will become apparent from the following detailed description and accompanying drawings.

DETAILED DESCRIPTION OF THE INVENTION

Although the present invention will be described in the context of a low power real-time clock, it is to be understood that the principles and methods of the invention can be applied to other types of systems which require a means of distinguishing between a system voltage supply and a battery power source when the system and battery have overlapping voltage ranges.

As noted, the low power real time clock circuitry of the present invention is designed to operate in an environment in which the system supply and battery supply have overlapping voltage ranges. In such a situation, the usual "higher supply" arbitration method does not operate properly. This potential problem is overcome by regulating the battery voltage such that the voltage range of the battery source is below that of the system supply. A standard regulator dissipates current at a much greater rate than is desirable for application of the present invention and hence is not suitable. This is because using a standard regulator has the effect of significantly reducing the lifetime of the battery, defeating the purpose of the invention. Overcoming this problem necessitates designing a voltage regulator which dissipates current at a fraction (approximately $\frac{1}{1000}$) the normal rate. In addition, the voltage regulator needs to be capable of being integrated with high speed digital circuitry on a single substrate in a manner which is compatible with a core CMOS process, a requirement which is realized by the present invention.

An important inventive aspect of the present invention is related to its manufacturability. As noted, a constraint which is satisfied by the present invention is the integration of the low power real time clock circuitry with high performance, high power digital circuits on a single substrate in a manner which requires no additional processing steps beyond those found in a core high-speed digital CMOS process. This aspect is non-trivial because the majority of high performance digital processes are designed to accommodate devices with high values of per unit transconductance, very low resistive materials, and only parasitic, non-optimized bipolar devices. Such processes tend to place a priority on speed over considerations of power consumption.

In contrast, in order to be effective, the low power real time clock circuitry of the present invention requires and utilizes techniques which are designed to reduce power consumption by four or five orders of magnitude compared to equivalent circuitry based on high performance digital processing methods. The design techniques involved in accomplishing this goal are reflected in the figures depicting the low power real time clock circuitry and include: layout-matched unit devices (e.g., resistor RGB in FIG. 4), a resistor network in FIG. 8, and the p-channel current distribution network of FIG. 8. The design methodology produces low-bias circuitry which operates in a more predictable manner (it is less sensitive to random $V_T$ or variations in resistance). Another design technique used in the present invention is that of matched transistors (e.g., the chain of p-channel devices in FIG. 9). This assists in extending the range of high impedance operation by better controlling parasitic resistance.

Figure 2A:
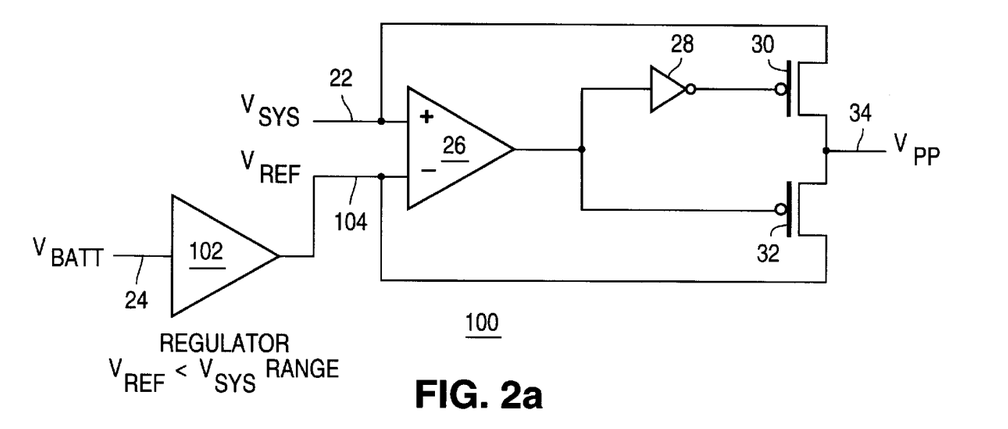
FIGS. 2(a)–(d) are block diagrams showing the (2a) power arbitration, (2b) low battery voltage detection, (2c) low power oscillator, and 2(d) power supply monitor circuitry of the present invention as embodied in the form of a low power real-time clock.

FIGS. 2(a)–(d) are block diagrams showing the (2a) power arbitration, (2b) low battery voltage detection, (2c) low power oscillator, and 2(d) power supply monitor circuitry of the present invention as embodied in the form of a low power real-time clock. As shown in FIG. 2(a), power arbitration circuit 100 has as inputs a system supply voltage ($V_{Sys}$) 22 and a reference voltage ($V_{Ref}$) 104, where $V_{Ref}$ is an output of voltage regulator 102. Regulator 102 is constructed such that $V_{Ref}$ is less than the lower limit of the system supply voltage range. The input to regulator 102 is the battery supply voltage, $V_{Batt}$ 24. Voltages 22 and 104 are input to comparator 26 which is configured to produce an output signal indicative of which input is higher. The output signal from comparator 26 is provided to inverter 28 and as a control signal to the gate of transistor 32. The output of inverter 30 is provided as a control signal to the gate of transistor 30. Arbitration circuit 100 functions to select the higher of either $V_{Sys}$ 22 or $V_{Ref}$ 104 as the power supply voltage for system internal power bus ($V_{pp}$) 34.

Low battery voltage detection circuit 110 of FIG. 2(b) acts to provide a warning signal 38 when power supply voltage 112 falls below reference voltage $V_{Ref}$ 104 produced by regulator 102. Power supply voltage $V_{Power}$ 112 represents either the battery voltage, $V_{BATT}$ 24 or the system supply voltage, $V_{Sys}$ 22, with a circuit 110 of the type shown in FIG. 2(b) being implemented for each of the $V_{Power}$ inputs. As shown in the figure, $V_{power}$ 112 and $V_{Ref}$ 104 serve as inputs to comparator 42, which outputs low battery detection warning signal 38 when $V_{Power}$ 112 falls below $V_{Ref}$. Voltage source 114 provides $V_{offset}$ which acts to provide early detection of a failing power supply by providing a voltage drop on the $V_{Power}$ input.

Figure 2B:
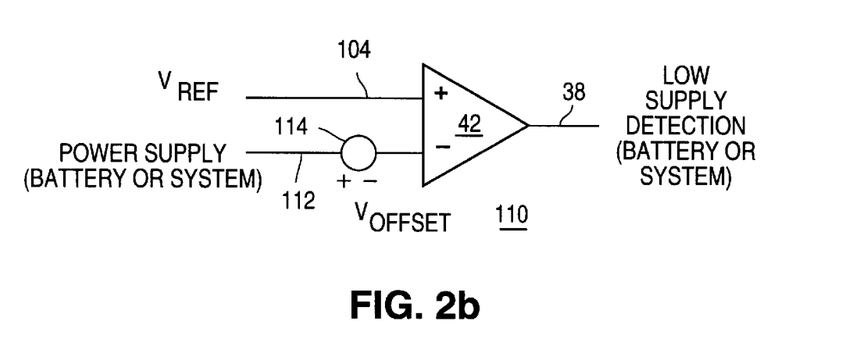
Figure 2C:
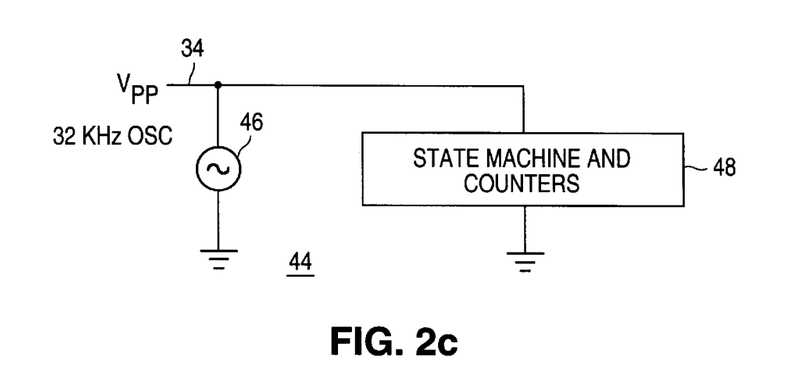

Low power oscillator circuitry 120 of FIG. 2(c) functions to provide a real-time clock signal in the form of oscillator 46 for the operation of a device such as a state machine or counter 48. In this case the voltage supplied on internal bus $V_{pp}$ 34 (which equals either the system voltage or the reference voltage) serves as the power supply for oscillator 46 and any other battery-backed circuitry.

Figure 2D:
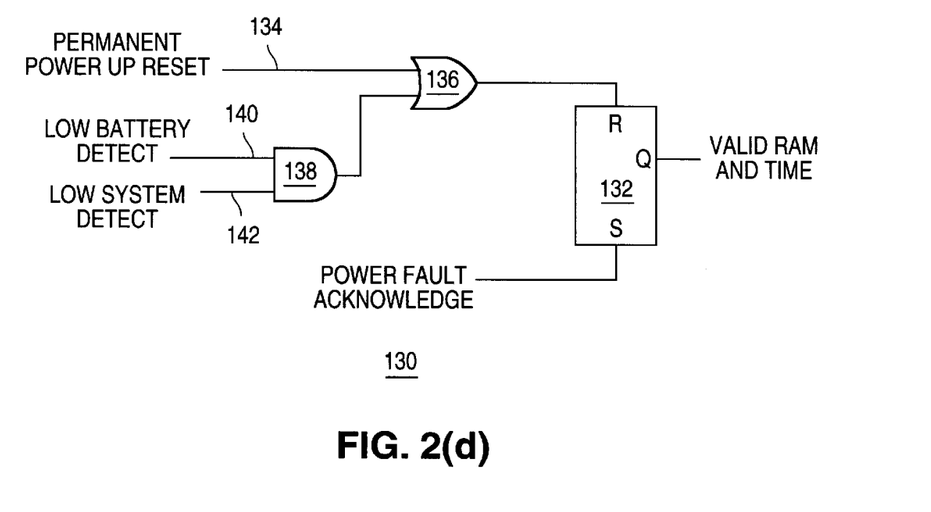

Continuous permanent power supply monitor circuit 130 of FIG. 2(d) utilizes the low power detection circuits of FIG. 2(b) in a permanent power failure detection scheme. A storage element 132 monitors the output of the low battery and low system supply detection circuits. Power-up reset circuitry operated from permanent power records a total loss of both system and battery power, producing signal 134 in such a situation. This provides a continuous monitoring of the power system, in contrast to most prior art systems which only sample the state of the battery supply during system operation. Continuous monitoring of the permanent power supply ensures the integrity of data during system or battery-backed operation and alerts the user to the possibility of data corruption during a total power loss. Possible applications of this type of circuitry include portable security devices where data integrity is critical.

In power supply monitoring circuit 130 of FIG. 2(d), permanent power-up reset signal 134 provides one input to OR gate 136. A second input to OR gate 136 is provided from the output of AND gate 138, which has as inputs low battery detect signal 140 and low system detect signal 142. Note that signals 140 and 142 are provided as the outputs of the low battery detection and low system supply detection circuits 110 shown in FIG. 2(b). When the output of OR gate 136 is high, it indicates either a situation of both a low battery and a low system supply voltage or a total loss of both system and battery power. This causes storage element 132 to be reset. The normal output of storage element 132 is a status signal indicating Valid RAM and Time conditions.

Figure 3:
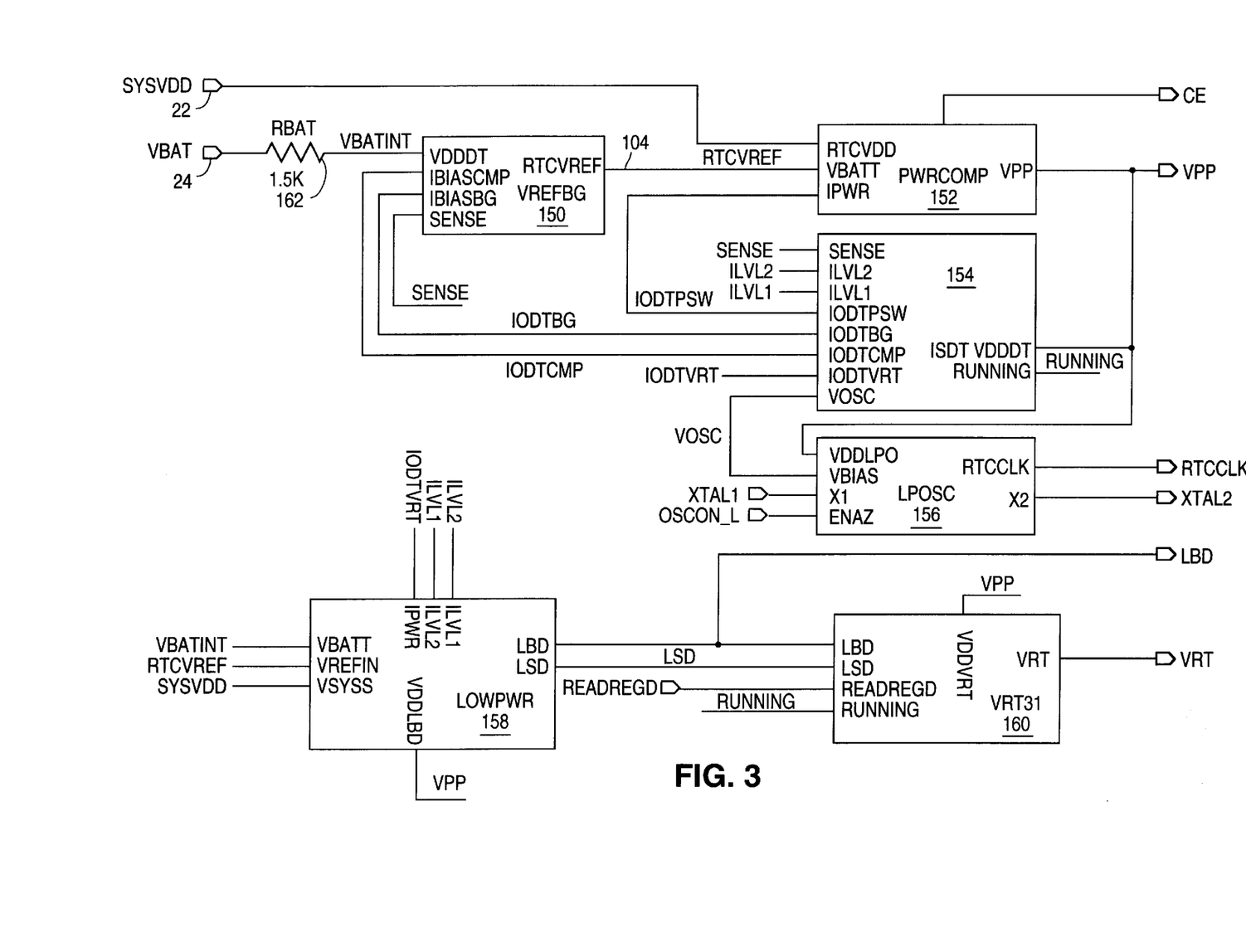
FIG. 3 is a block diagram showing the primary components of the real-time clock circuitry of the present invention.

FIG. 3 is a block diagram showing the primary components of the real-time clock circuitry of the present invention. As shown in the figure, power comparator module 152 has two primary inputs, system supply voltage 22 (labelled "SYSVDD" in the figure and input to node "RTCVDD" of comparator 152) and a reference voltage 104 (labelled "RTCVREF" in the figure and input to node "VBATT" of comparator 152). Reference voltage 104 is produced at the output of voltage regulator 150 which has as an input voltage VBATINT, with that signal resulting from conditioning battery supply voltage 24 by means of resistor 162 (labelled "RBAT" in the figure). RBAT 162 provides a backcharge limitation between the battery source 24 and the rest of the circuitry. Regulator 150 has as another input a current produced by subthreshold current source 154, which provides a current that is proportional to absolute temperature. This current interacts with the components of voltage regulator 150 to produce a temperature and supply voltage compensated voltage which is then buffered to supply sufficient power for the battery backed circuitry of the system.

The use of regulator 150 provides a convenient means for alerting the system to a low battery voltage condition. This low battery detection is implemented by low battery detection circuit 158. The inputs to circuit 158 are reference voltage 104 produced by regulator 150 (labelled "RTCVREF" in the figure and input to node "VREFIN" of low battery detection circuit 158) and the conditioned battery voltage 24 (labelled "VBATINT" in the figure and input to node "VBATT", of low battery detection circuit 158). Low battery voltage detection circuit 158 senses when the battery voltage falls to approximately the same voltage as the reference voltage and outputs an alert signal (labelled "LBD" in the figure) in such a case.

Low power oscillator 156 has as an input an oscillator voltage signal produced by subthreshold current source 154 (labelled "VOSC" in the figure and input to node "VDDLPO" of oscillator 156). The output of oscillator 156 is a real-time clock signal (labelled "RTCCLK" in the figure) which is used to control the operation of other circuitry such as a state machine or counter.

Valid RAM and Time (VRT) control circuit 160 is used to detect when the system supply voltage drops to within a predetermined amount of the regulated reference voltage. The combination of a low battery voltage detection signal (from circuit 158) and low system supply voltage causes the storage element of VRT control circuit 160 to indicate the loss of reliable battery supply as a backup power source. A signal from subthreshold current source 154 (labelled "RUNNING" in the figure) acts as a power up initialization for the storage element.

Figure 4:
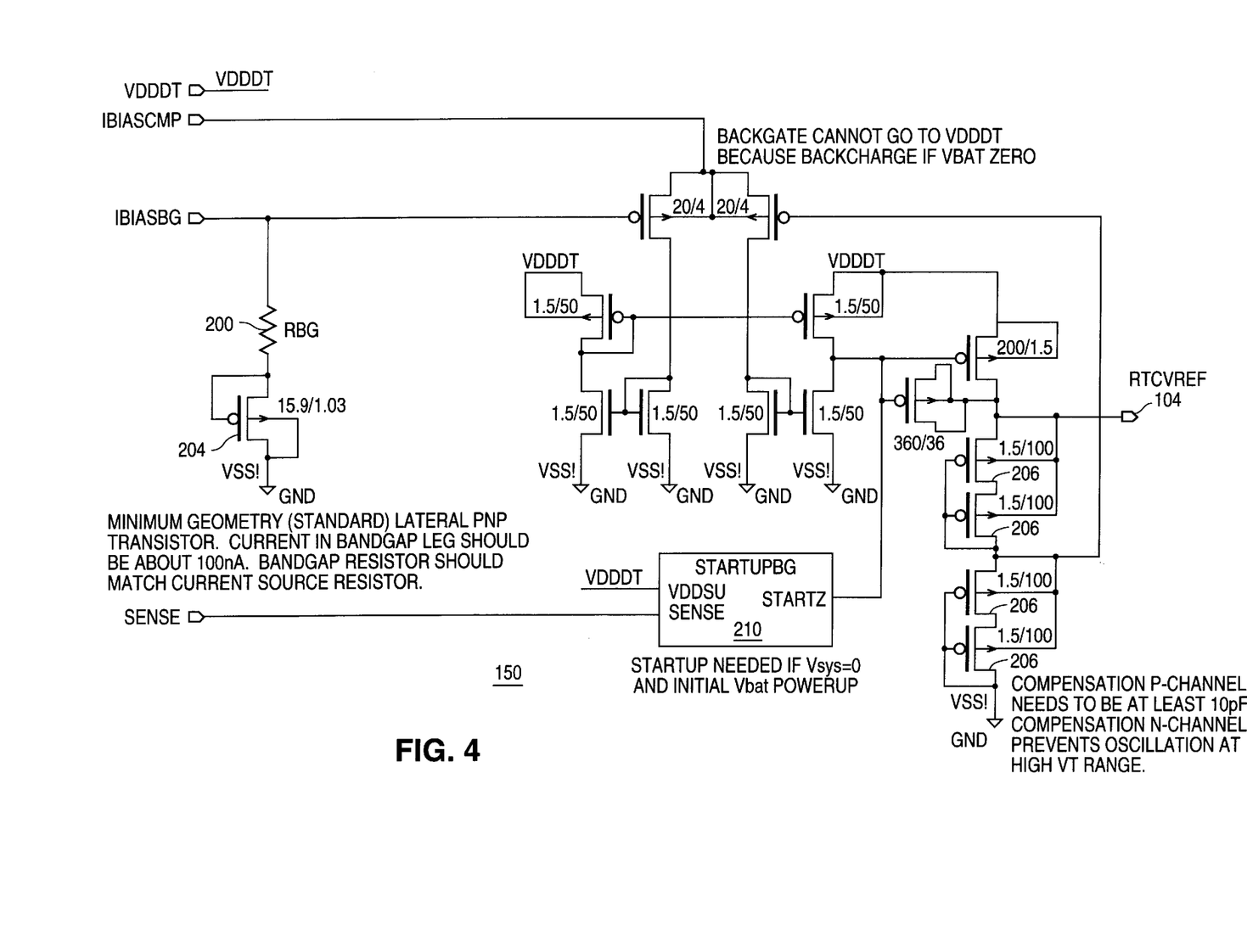
FIG. 4 is a schematic of the voltage regulator of the real-time clock circuitry of the present invention.

FIG. 4 is a schematic of voltage regulator 150 of the real-time clock circuitry of the present invention. Regulator 150 includes a stage which has as an input (at the node labelled "IBIASBG") a current proportional to absolute temperature which is produced by subthreshold current source 154 of FIG. 3. This stage of regulator 150 produces two voltage components: (1) a first voltage component having a positive temperature coefficient; and (2) a second voltage component having a negative temperature coefficient. If the two voltage components are summed in the proper proportions, the respective temperature variations of the summed components can be made to approximately cancel out. Since the current source is designed to be insensitive (to first order) to the supply voltage, the voltage produced at node IBIASBG is approximately independent of both supply and temperature.

Regulator 150 also includes a voltage follower stage which buffers and scales the sum of the two voltage components to a desired operating range and prevents the voltage input to the regulator from being loaded by circuitry operating from the reference supply. Regulator 150 utilizes a silicon bandgap-referenced technique to regulate the battery voltage to a value lower than the system supply voltage range. Regulator 150 consumes an insignificant amount of current (often less than 1 micro-ampere) so that the battery life is not appreciably affected. The variation in reference voltage 104 produced by regulator 150 is less than that of the battery itself. The current (labelled "IBIASBG" in the figure) produced by subthreshold current source 154 (shown in greater detail in FIG. 5) interacts with resistor RBG 200 and lateral PNP transistor 204 to provide the temperature and supply voltage compensated voltage. The corresponding voltage is then buffered and scaled by a resistor divider to provide sufficient power for the battery backed circuitry.

As mentioned, the regulator is based on a silicon bandgap reference technique. The bandgap regulates the battery voltage variation to a much narrower voltage range than is present in the unregulated battery. This also serves to translate the battery voltage to a range that permits the battery supplied power to be distinguished from the system supplied power (3.3 volts ±10% in the example). Output reference voltage 104 is typically 2.3 volts.

A bandgap reference such as that contained in regulator 150 provides a voltage which includes a component having a positive temperature coefficient and a component having a negative temperature coefficient. The components are added together in appropriate proportions to obtain a voltage which is approximately independent of temperature.

In regulator 150, the base emitter voltage of parasitic lateral PNP transistor 204 supplies the negative temperature coefficient component. The previously discussed subthreshold current source supplies a current which is proportional to absolute temperature (PTAT) at node IBIASBG to transistor 204 and bandgap resistor 200. The ratio of a subthreshold current source resistor and bandgap resistor 200 is chosen in a manner to add the two voltage components in the proper proportions to minimize the effect on the reference voltage of variations in temperature. The voltage produced by the actions of the subthreshold current source, resistor 200, and transistor 204 determine the value of reference voltage 104, which is approximately twice the 1.1–1.2 volts present at node IBIASBG.

The voltage follower stage contained in regulator 150 acts to buffer and scale the voltage present at node IBIASBG. The voltage follower stage is a current limited operational amplifier which outputs a drive voltage that is approximately 2 times the input reference voltage at node IBIASBG (producing in this example, approximately 2.3 volts as the reference voltage 104). The two times voltage multiplication is achieved by a matched set of P-channel transistors with the Vbs equaling zero for each pair. This allows voltage sensing without the current loading of typical resistive materials.

The scaling method employed by the voltage follower stage utilizes the RDIV devices 206 shown in FIG. 4. In high performance core CMOS processes, very large resistors (having values greater than 10 Meg) are difficult to manufacture in an economical or reliable fashion. For scaling of reference voltages, resistors are needed to sense the output voltage and provide a feedback control mechanism to stabilize the output voltage. For a battery reference, very large resistors are needed to prevent prohibitive power consumption and extend battery life. In the FIG. 4 circuit, voltage scaling is performed by a matched set of large-L P-channel transistors with Vdg=0 and Vbs=0 for each pair. Since the devices are connected in series, the same current flows through them. With a matched layout utilizing cross-coupled matched unit devices, each pair has a matched voltage drop. This provides a convenient divide-by-two voltage function. The concept shown in FIG. 4 can of course be extended to a divide-by-n (where n is an integer) voltage function.

Regulator 150 also includes startup circuit 210 which is used to prevent the bootstrap condition of zero volts output, zero amperes input which can occur in the absence of a system supply voltage. This is used because the subthreshold current source power supply could in some situations be the output of the bandgap.

Figure 5:
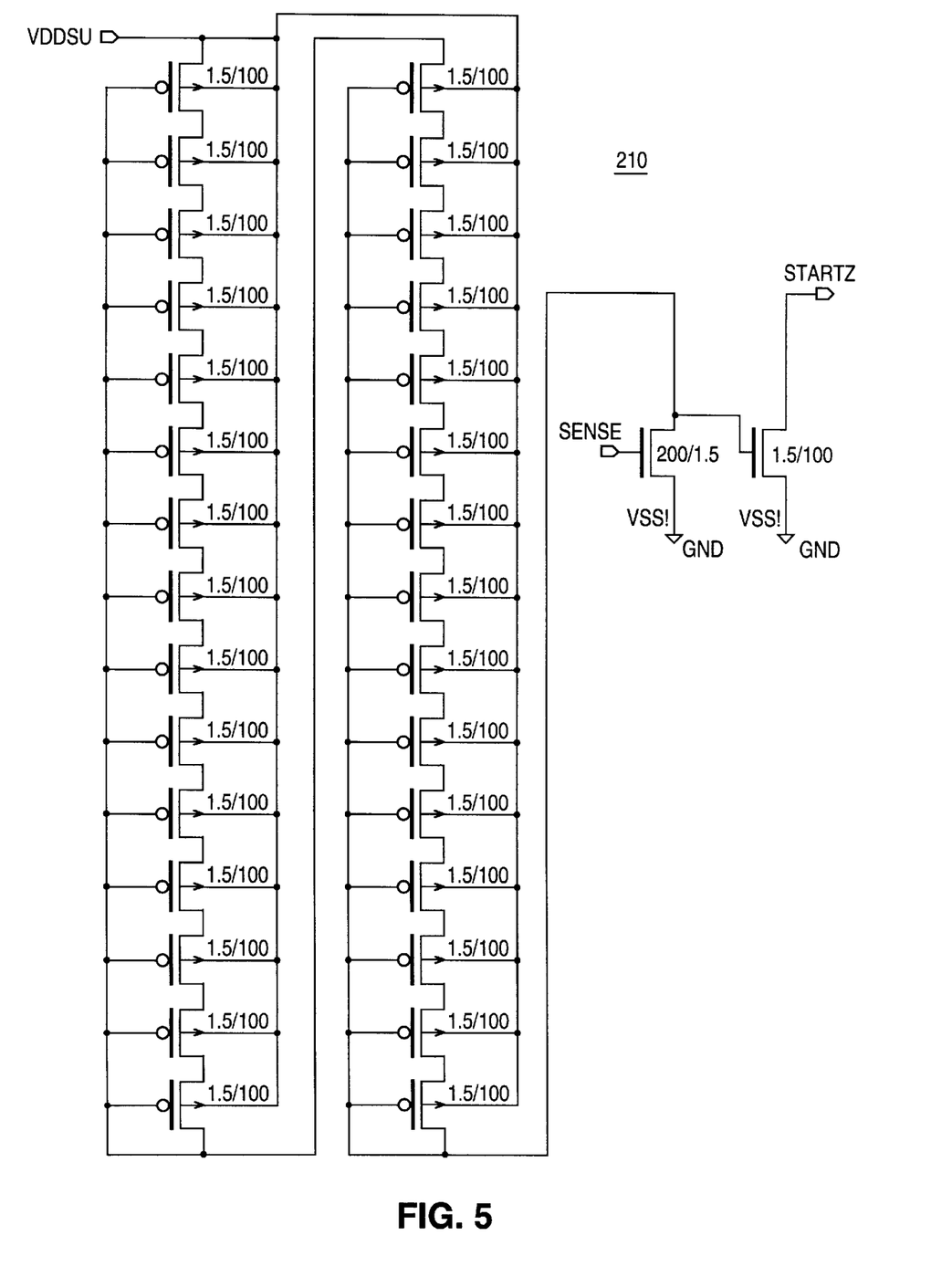
FIG. 5 is a schematic diagram of the startup circuit contained in the regulator of FIG. 4.

FIG. 5 is a schematic diagram of startup circuit 210 contained in regulator 150 of FIG. 4. Startup circuit 210 senses if the subthreshold current source has started. This is important because the source may not have started if the bandgap has not initialized. If startup circuit 210 senses that the current source has not started, the bandgap output is driven directly to the battery voltage level. When the current source initializes, the bandgap output becomes regulated.

Figure 6:
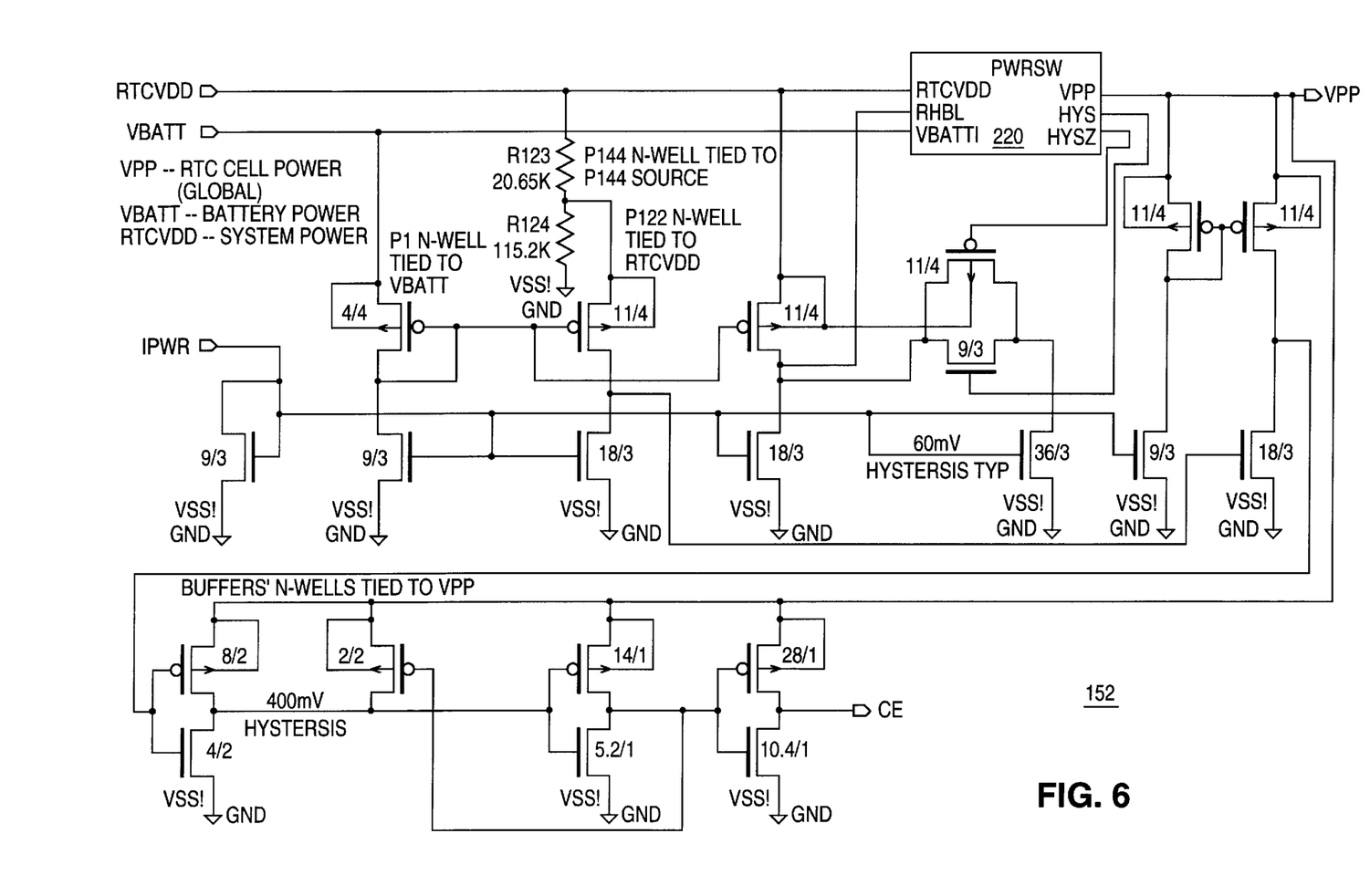
FIG. 6 is a schematic diagram of the power comparator module of the real-time clock circuitry of the present invention.

FIG. 6 is a schematic diagram of power comparator module 152 of the real-time clock circuitry of the present invention. Power comparator 152 arbitrates between the system supply voltage (labelled "RTCVDD" in the figure) and the regulated battery supply voltage (Labelled "VBATT" in the figure) produced by regulator 150 as reference voltage 104.

Figure 7:
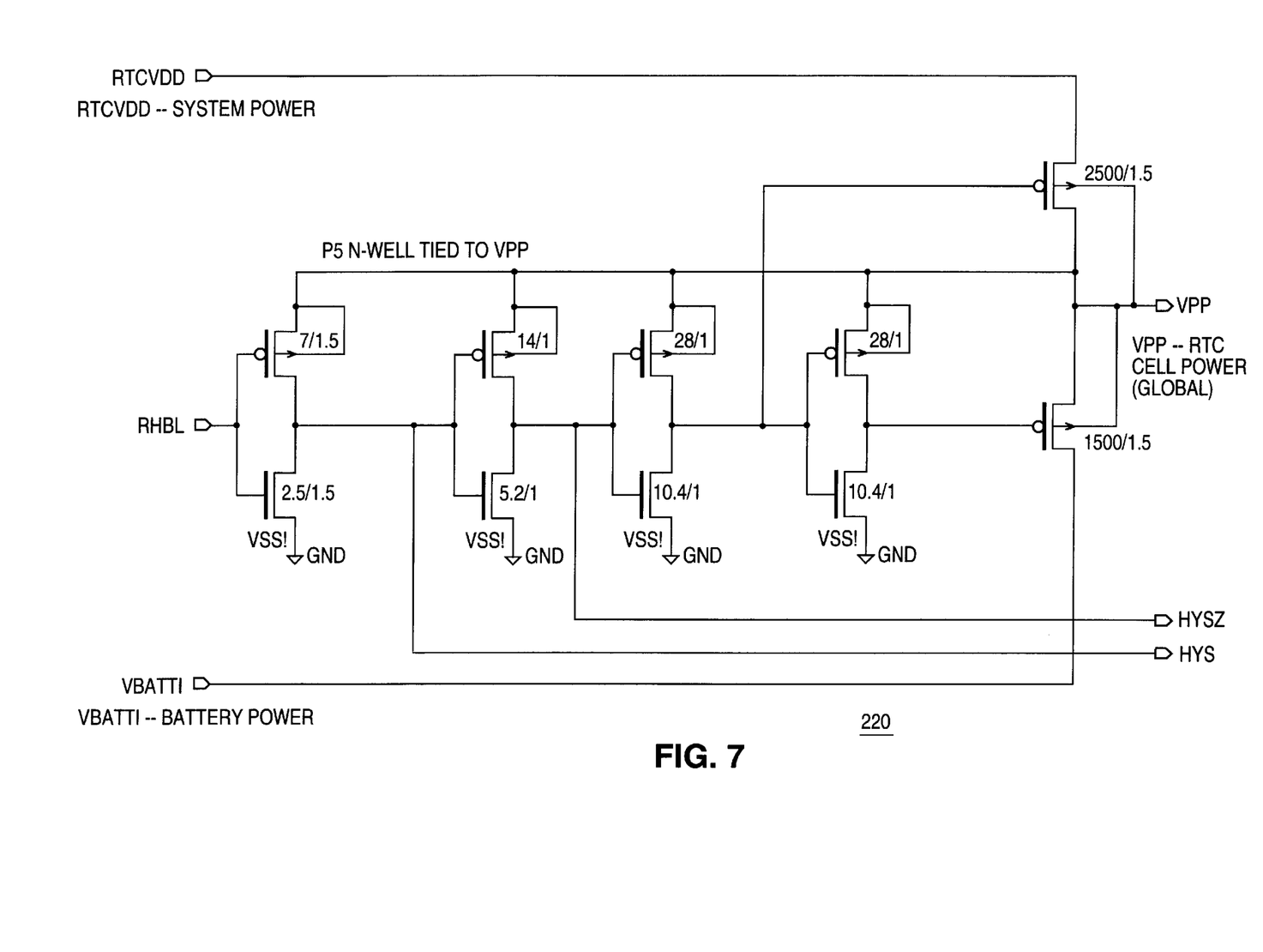
FIG. 7 is a schematic diagram of the power switch circuit of FIG. 6.

Power comparator 152 utilizes current limited comparators to connect the internal supply rail (labelled "VPP" in the figure) to either the system supply voltage or regulated battery voltage. The comparators connect VPP to the higher voltage of RTCVDD or VBATT when RTCVDD=VBATT. An additional comparator utilizes a resistor divider to provide an early detection of falling power (labelled "CE" for chip enable in the figure). The CE signal switches low when RTCVDD is approximately 1.2 times the regulated battery voltage. Power comparator 152 includes power switch circuit 220 which connects VPP to the system supply or the regulated battery supply upon receipt of a control signal (labelled "RHBL" in the figure) from the comparator stages of power comparator 152. FIG. 7 is a schematic diagram of power switch circuit 220 of FIG. 6.

Figure 8:
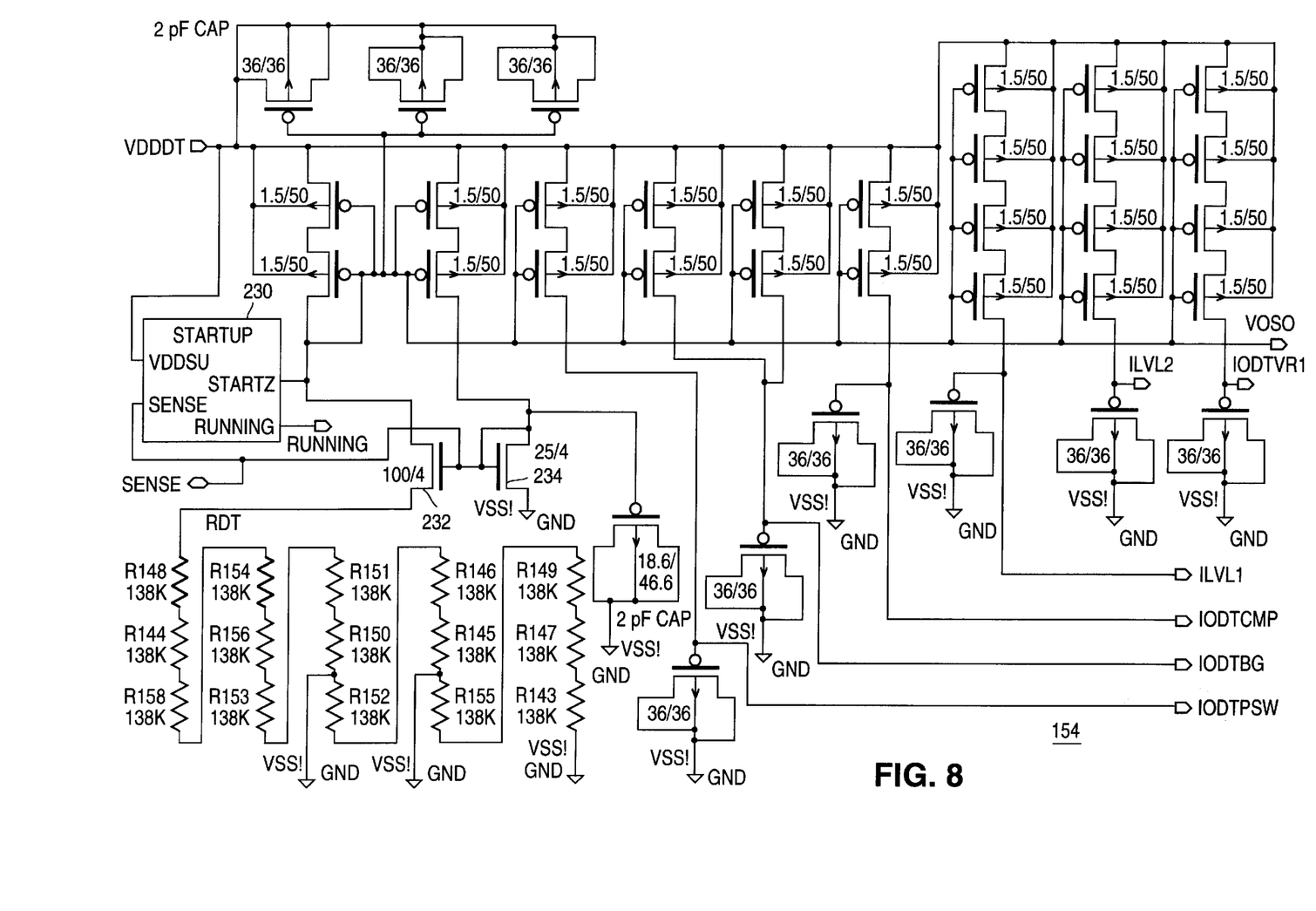
FIG. 8 is a schematic diagram of the subthreshold current source of the real-time clock circuitry of the present invention.

FIG. 8 is a schematic diagram of subthreshold current source 154 of the real-time clock circuitry of the present invention. As previously discussed, current source 154 produces a current which is proportional to absolute temperature (PTAT, labelled "IODTBG" in the figure) to the regulator. Current source 154 also provides a well-controlled, low magnitude bias current (labelled "IODT"_ in the figure) which is distributed to many of the analog sections of the real-time clock circuitry. This facilitates the design of low power circuit modules.

In the circuit shown in FIG. 8, the output current ($I_{out}$) taken flowing through the node labelled "RDT" can be expressed as:

$$I_{out}=[kT/q* \ln((100/4)/(25/4))]/1.1 \text{ Meg},$$

where
  k=Boltzmann's constant;
  q=electron charge; and
  T=absolute temperature.

At room temperature, $I_{out}$ is equal to approximately 36 nanoamperes. The 1.1 Meg divisor term arises because the resistor network of FIG. 8 has approximately that value. Current source 154 also contains current mirrors and bypass capacitors which serve to condition and distribute the output current. The N-channel devices in the current generation stage (labelled elements 232 and 234 in the figure) operate in the subthreshold region. The remaining p-channel devices in the current mirrors act to distribute various proportions of the generated current to the remainder of the circuit. The p-channel devices are designed to not operate in the subthreshold region. This serves to scale and match the generated reference current more accurately. Also included in current source 154 is a startup circuit 230 typically found in bootstrap circuits. Subthreshold current circuit 154 is powered by the arbitrated power source (labelled "VPP" in FIG. 3) and is designed to be independent of variations in the value of VPP (to first order).

Figure 9:
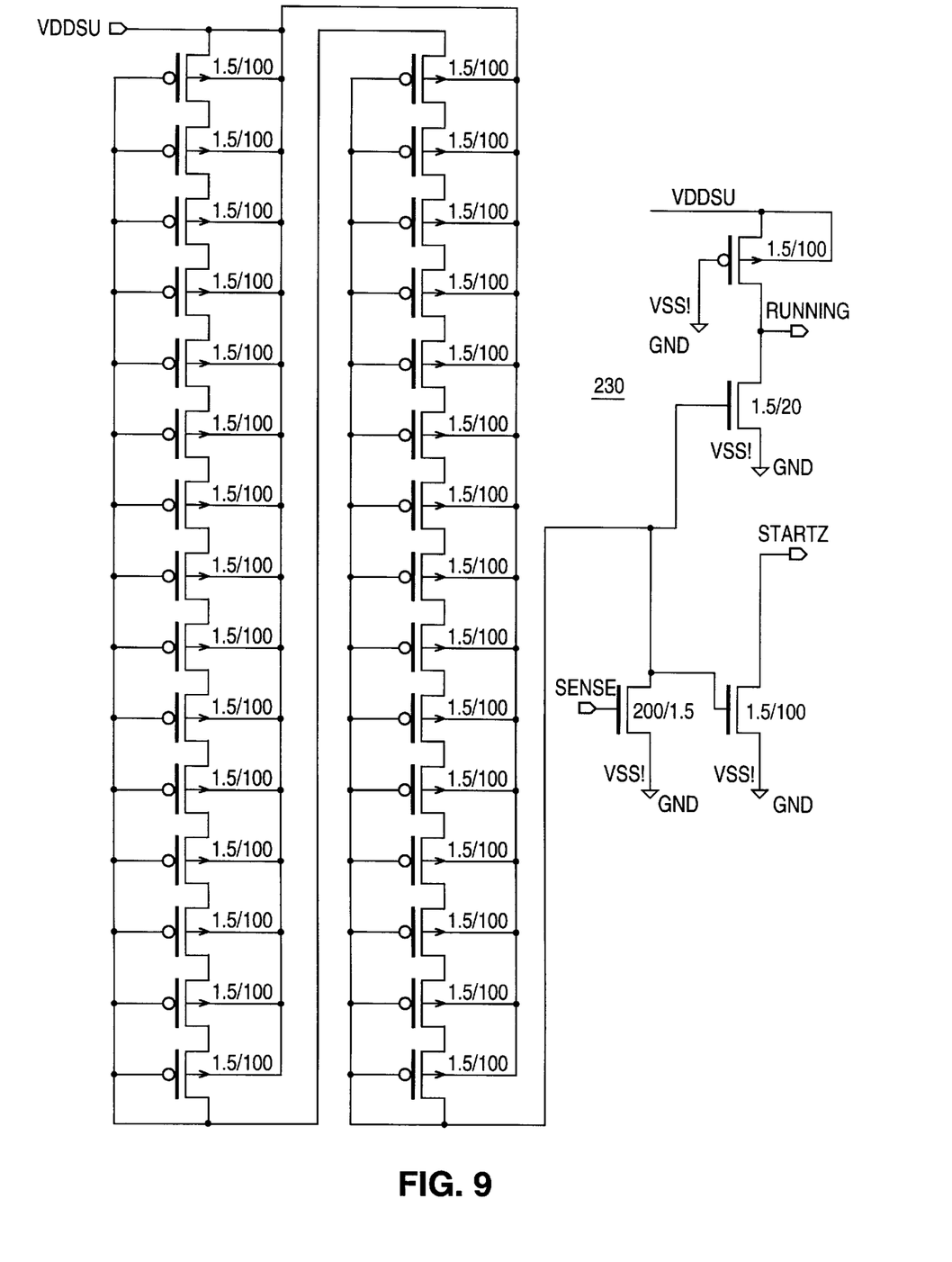
FIG. 9 is a schematic diagram of the startup circuit contained in the current source of FIG. 8.

FIG. 9 is a schematic diagram of startup circuit 230 contained in current source 154 of FIG. 8. This circuit is similar in operation to the startup circuit described with reference to FIG. 5, but also produces a digital signal (labelled "RUNNING" in the figure).

Figure 10:
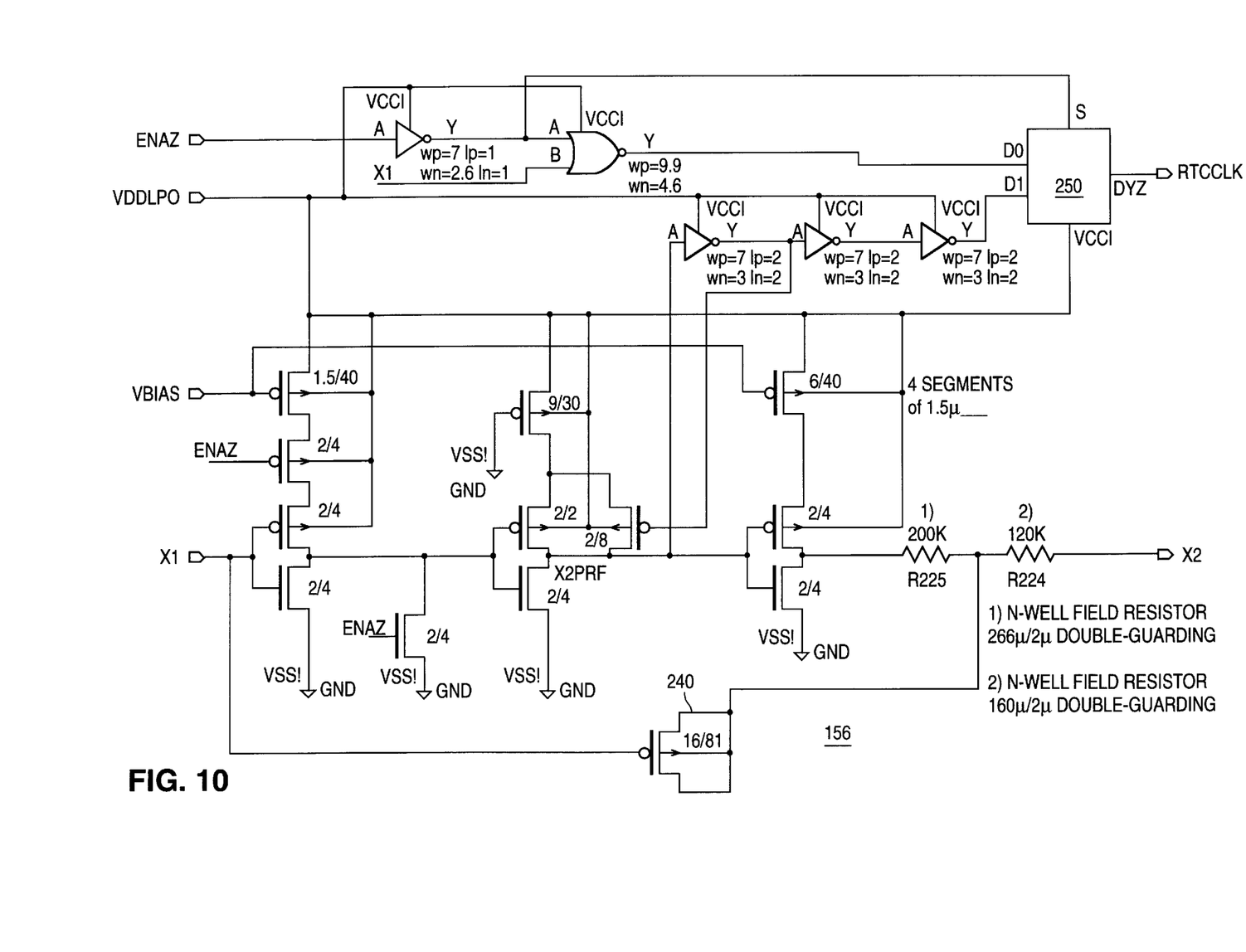
FIG. 10 is a schematic diagram of the low power oscillator circuit of the real-time clock circuitry of the present invention.

FIG. 10 is a schematic diagram of low power oscillator circuit 156 of the real-time clock circuitry of the present invention. Oscillator 156 is implemented as a current-limited, three-stage oscillator. The circuit is compensated by a shunt capacitor 240 in a manner similar to that described in U. S. Pat. No. 5,528,201, entitled "Pierce Crystal Oscillator Having Reliable Startup for Integrated Circuits", the contents of which is hereby incorporated by reference.

Since the low power aspect of oscillator 156 limits the oscillator amplifier bandwidth (to approximately 32 KHz in the present embodiment), a multiplexer 250 provides a parallel path for testing purposes. A tester can be used to drive a faster external clock through node X1 (at approximately 5 MHz for example) to toggle the oscillator clock signal output (labelled "RTCCLK" in the figure) and verify the real-time clock counter functionality.

Figure 11:
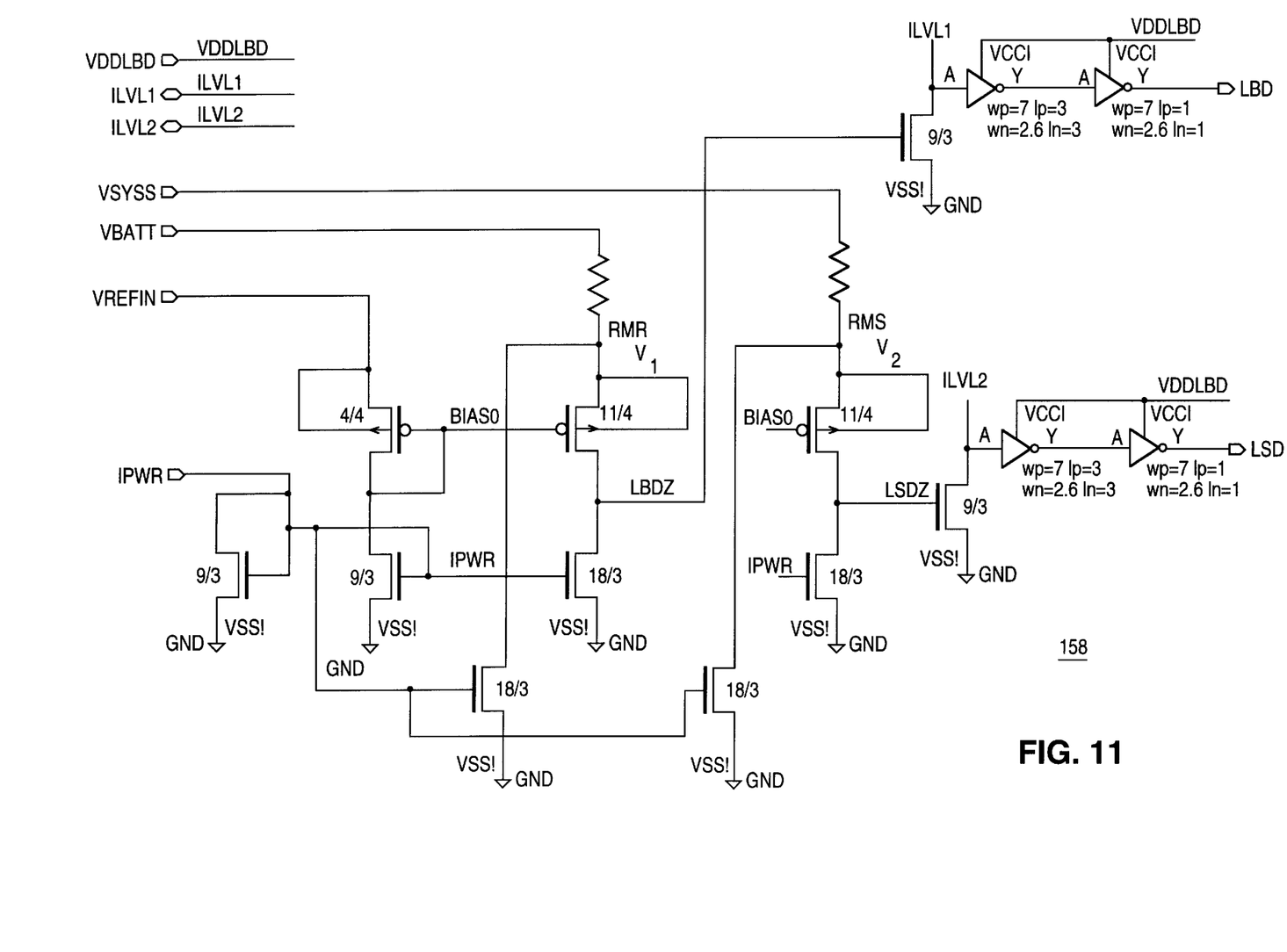
FIG. 11 is a schematic diagram of the low battery detection circuit of the real-time clock circuitry of the present invention.

FIG. 11 is a schematic diagram of low battery detection circuit 158 of the real-time clock circuitry of the present invention. As is well known, battery voltage level monitoring is an important feature of any battery-backed system. Low battery detection circuit 158 contains two comparators.

A first comparator detects when the battery voltage (labelled "VBATT" in the figure) drops to within approximately 100 milli-volts of the regulated battery voltage (labelled "VREFIN" in the figure). This is used to notify the user of a low battery condition during normal operation using the system supply as the voltage source. The second comparator detects when the system voltage (labelled "VSYSS" in the figure) drops to within approximately 100 milli-volts of the regulated battery voltage (VREFIN). When the comparators detect both low battery and system voltages, the storage element of Valid RAM and Time (VRT) control circuit 160 (shown in detail in FIG. 12) reflects this condition as a loss of a reliable battery backed supply.

Figure 12:
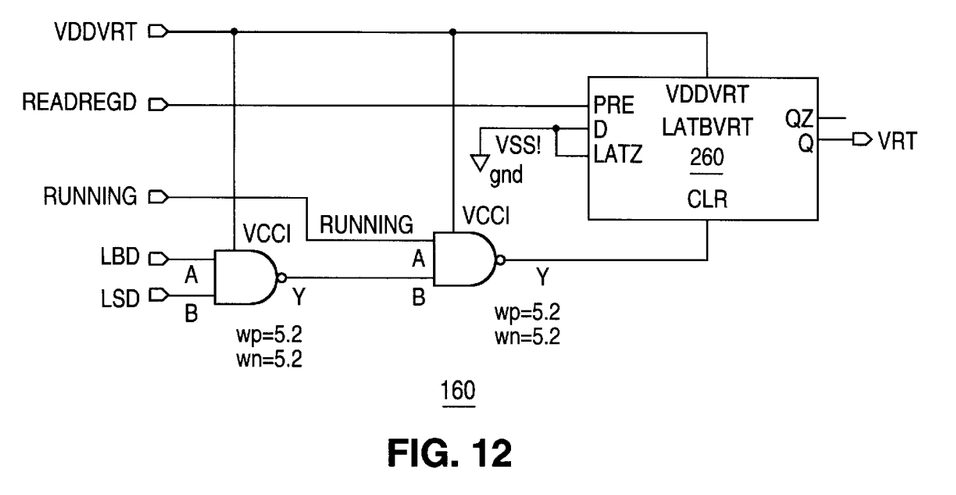
FIG. 12 is a schematic diagram of the Valid RAM and Time (VRT) control circuit of the real-time clock circuitry of the present invention.

FIG. 12 is a schematic diagram of Valid RAM and Time (VRT) control circuit 160 of the real-time clock circuitry of the present invention. As noted, when the comparators of FIG. 11 detect both low battery and system voltages, storage element 260 of VRT control circuit 160 reflects this condition. A signal from current source 154 of FIG. 8 (labelled "RUNNING" in the figure) acts as a power up initialization for storage element 260.

The low power real time clock circuitry of the present invention is designed to operate in an environment in which the system supply and battery supply have overlapping voltage ranges. This is achieved by regulating the battery voltage to a level below that of the system supply voltage range using a specially designed voltage regulator which dissipates current at a vastly reduced rate compared to standard regulators implemented using traditional high speed high power CMOS design methods. The combination of low power consumption and compatibility with standard CMOS processes make the present invention ideal for use in low power battery backed devices which include high performance digital circuits.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A power arbitration circuit for determining which one of a first and a second voltage source is provided as an output voltage source, wherein the first and second voltage sources produce first and second voltage signals, respectively, having overlapping voltage ranges, the power arbitration circuit comprising:

a current source which produces a current having a magnitude which is proportional to temperature, the current source further comprising
      a current generation stage containing a transistor operating in a sub-threshold region of the transistor;
   a regulator configured to receive the first voltage signal as an input and to produce a reference voltage signal as an output, wherein the reference voltage signal does not overlap the second voltage signal voltage range, the regulator further comprising
      a first voltage drop element having as an input the current produced by the current source and producing a voltage having a positive temperature coefficient as an output; and
      a second voltage drop element having as an input the current produced by the current source and producing a voltage having a negative temperature coefficient as an output;
   a comparator having as inputs the reference voltage signal output by the regulator and the second voltage signal, and producing as an output a control signal indicative of which of the two comparator inputs is greater; and
   a switch having the control signal as an input, the switch responding to the control signal by providing the indicated one of the comparator inputs as the output voltage source.

2. The power arbitration circuit of claim 1, wherein the first voltage signal is provided by a battery.

3. The power arbitration circuit of claim 1, wherein the regulator further comprises:

a startup circuit which provides the first voltage signal as the output of the regulator in the situation in which the current source has no output.

4. The power arbitration circuit of claim 1, wherein the first voltage drop element has a first value and the second voltage drop element has a second value, and further, wherein the first and second values are chosen so that a sum of the outputs of the first and second voltage drop elements is approximately independent of temperature.

5. The power arbitration circuit of claim 1, wherein the reference voltage signal is below the range of the second voltage signal.

6. A low power clock circuit, comprising:

a power arbitration circuit for determining which one of a first voltage source and a second voltage source is provided as an output voltage source, wherein the first and second voltage sources produce first and second voltage signals, respectively, having overlapping voltage ranges, the power arbitration circuit producing an output which is the greater of the second voltage signal and a reference voltage signal derived from the first voltage signal, and further, wherein the reference voltage signal is not within the range of the second voltage signal;
   an oscillator configured to have the output of the power arbitration circuit as an input and producing a clock signal as an output; and
   a power supply detection circuit having as inputs the reference voltage signal and the first voltage signal, and producing a low supply detection signal as an output when the first voltage signal is less than the reference voltage signal.

7. A low power clock circuit, comprising:

a power arbitration circuit for determining which one of a first voltage source and a second voltage source is provided as an output voltage source, wherein the first and second voltage sources produce first and second voltage signals, respectively, having overlapping voltage ranges, the power arbitration circuit producing an output which is the greater of the second voltage signal and a reference voltage signal derived from the first voltage signal, and further, wherein the reference voltage signal is not within the range of the second voltage signal;
   an oscillator configured to have the output of the power arbitration circuit as an input and producing a clock signal as an output; and
   a power supply detection circuit having as inputs the reference voltage signal and the second voltage signal, and producing a low supply detection signal as an output when the second voltage signal is less than the reference voltage signal.

8. A low power clock circuit, comprising:

a power arbitration circuit for determining which one of a first voltage source and a second voltage source is provided as an output voltage source, wherein the first and second voltage sources produce first and second voltage signals, respectively, having overlapping voltage ranges, the power arbitration circuit producing an output which is the greater of the second voltage signal and a reference voltage signal derived from the first voltage signal, and further, wherein the reference voltage signal is not with the range of the second voltage signal;

an oscillator configured to have the output of the power arbitration circuit as an input and producing a clock signal as an output;

a regulator configured to receive the first voltage signal as an input and to produce the reference voltage signal as an output;

a comparator having as inputs the reference voltage signal output by the regulator and the second voltage signal, and producing as an output a control signal indicative of which of the two comparator inputs is greater;

a switch having the control signal as an input, the switch responding to the control signal by providing the indicated one of the comparator inputs as the output voltage source;

and wherein the power arbitration circuit further includes a current source which produces a current having a magnitude which is proportional to temperature, the current source further including a current generation stage containing a transistor operating in a sub-threshold region of the transistor.

9. The low power clock circuit of claim 8, wherein the regulator further comprises:

a first voltage drop element having as an input the current produced by the current source and producing a voltage having a positive temperature coefficient as an output; and a second voltage drop element having as an input the current produced by the current source and producing a voltage having a negative temperature coefficient as an output.

10. The low power clock circuit of claim 8, wherein the regulator further comprises:

a startup circuit which provides the first voltage signal as the output of the regulator in the situation in which the current source has no output.

11. The power arbitration circuit of claim 8, wherein the first voltage drop element has a first value and the second voltage drop element has a second value, and further, wherein the first and second values are chosen so that a sum of the outputs of the first and second voltage drop elements is approximately independent of temperature.

* * * * *